(12) United States Patent
Silvestri

(10) Patent No.: US 7,142,032 B2
(45) Date of Patent: Nov. 28, 2006

(54) TUNABLE DELAY CIRCUIT

(76) Inventor: Paul A. Silvestri, 2466 N. Stone Pl., Meridian, ID (US) 83642

( * ) Notice: Subject to any disclaimer, the term of this patent is extended or adjusted under 35 U.S.C. 154(b) by 0 days.

(21) Appl. No.: 11/003,098

(22) Filed: Dec. 3, 2004

(65) Prior Publication Data

US 2005/0083092 A1   Apr. 21, 2005

Related U.S. Application Data

(62) Division of application No. 10/147,645, filed on May 16, 2002, now Pat. No. 6,900,685.

(51) Int. Cl.
*H03H 11/26* (2006.01)

(52) U.S. Cl. .................. 327/277; 327/149; 327/158; 327/284

(58) Field of Classification Search ........ 327/276–277, 327/284, 146, 149, 152, 153, 158, 161
See application file for complete search history.

(56) References Cited

U.S. PATENT DOCUMENTS

| | | |
|---|---|---|
| 5,717,353 A | 2/1998 | Fujimoto |
| 5,831,423 A | 11/1998 | Mancini |
| 5,946,244 A | 8/1999 | Manning |
| 6,002,281 A | 12/1999 | Jones et al. |
| 6,085,345 A | 7/2000 | Taylor |
| 6,108,793 A | 8/2000 | Fujii et al. |
| 6,184,753 B1 | 2/2001 | Ishimi et al. |
| 6,191,624 B1 | 2/2001 | Matsuya |
| 6,191,632 B1 * | 2/2001 | Iwata et al. .................. 327/295 |
| 6,201,424 B1 | 3/2001 | Harrison |
| 6,275,079 B1 | 8/2001 | Park |
| 6,337,590 B1 * | 1/2002 | Millar .......................... 327/158 |
| 6,378,079 B1 | 4/2002 | Mullarkey |
| 6,385,129 B1 | 5/2002 | Silvestri |
| 6,414,903 B1 | 7/2002 | Keeth et al. |
| 6,421,801 B1 | 7/2002 | Maddux et al. |
| 6,456,130 B1 | 9/2002 | Schnell |
| 6,492,852 B1 | 12/2002 | Fiscus |
| 6,498,528 B1 | 12/2002 | Inagaki et al. |
| 6,509,763 B1 * | 1/2003 | Taguchi et al. ................ 327/58 |
| 6,539,490 B1 | 3/2003 | Forbes et al. |
| 6,605,969 B1 * | 8/2003 | Mikhalev et al. ........... 327/158 |
| 6,661,717 B1 | 12/2003 | Gomm et al. |
| 6,680,874 B1 | 1/2004 | Harrison |
| 6,727,739 B1 * | 4/2004 | Stubbs et al. ................ 327/161 |
| 6,774,687 B1 | 8/2004 | Gomm et al. |
| 6,803,826 B1 * | 10/2004 | Gomm et al. .................. 331/11 |
| 6,819,151 B1 * | 11/2004 | Mikhalev et al. ........... 327/141 |
| 6,836,166 B1 * | 12/2004 | Lin et al. ..................... 327/158 |
| 6,876,594 B1 | 4/2005 | Griesmer et al. |
| 6,900,685 B1 | 5/2005 | Silvestri |
| 2002/0017939 A1 | 2/2002 | Okuda et al. |
| 2003/0215040 A1 | 11/2003 | Bell et al. |

* cited by examiner

*Primary Examiner*—Timothy P. Callahan
*Assistant Examiner*—Cassandra Cox

(57) ABSTRACT

A delay locked loop includes a forward path for receiving an input signal to provide an output signal, a feedback path for providing a feedback signal based on the output signal, and a controller responsive to a timing relationship between the feedback signal and the input signal for adjusting a timing of the output signal. The feedback path includes an adjustable delay circuit for adjusting a timing of the feedback signal.

63 Claims, 7 Drawing Sheets

TUNABLE DELAY CIRCUIT

This application is a Divisional of U.S. application Ser. No. 10/147,645, filed May 16, 2002, now U.S. Pat. No. 6,900,685, which is incorporated herein by reference.

FIELD OF THE INVENTION

The present invention relates generally to signal processing, and in particular, to delay circuits.

BACKGROUND OF THE INVENTION

Delay circuits delay an input signal to generate an output signal which is a delayed version of the input signal. Most delay circuits have a specified delay between the input and output signals. In some applications, some delay circuits cause the actual delay between the input and output signals to be different from the specified delay because of changes in operating conditions such as operating voltage and temperature. Therefore, some of these delay circuits are unsuitable for some applications when the operating condition changes.

For these and other reasons stated below, and which will become apparent to those skilled in the art upon reading and understanding the present specification, there is a need for an improved delay circuit.

SUMMARY OF THE INVENTION

Embodiments of the invention provide a delay circuit that can be configured to adjust a delay between an input signal and an output signal.

In one aspect, the delay circuit has a comparator connected to a reference generator. The comparator includes a first stage for receiving an input signal, and a second stage connected to the first stage for receiving a reference signal to output an output signal. The input and output signals have a delay which is based on a signal relationship between the input and reference signals. The reference generator includes a plurality of configurable devices configured to vary the reference signal to adjust the delay between the input and output signals.

In another aspect, a method includes receiving an input signal and a reference signal. The method also includes producing an output signal. The input and output signals have a delay. Further, the method includes varying the reference signal to adjust the delay.

DESCRIPTION OF EMBODIMENTS

The following description and the drawings illustrate specific embodiments of the invention sufficiently to enable those skilled in the art to practice it. Other embodiments may incorporate structural, logical, electrical, process, and other changes. Examples merely typify possible variations. Portions and features of some embodiments may be included in or substituted for those of others. The scope of the invention encompasses the full ambit of the claims and all available equivalents.

Figure 1:
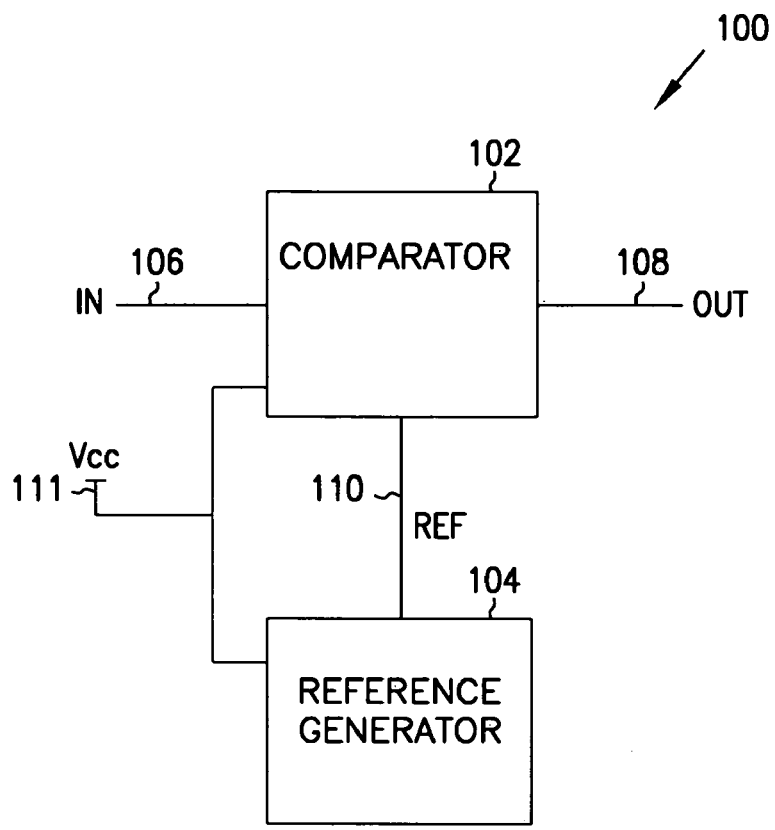
FIG. 1 shows a delay circuit according to an embodiment of the invention.

FIG. 1 shows a delay circuit according to an embodiment of the invention. Delay circuit 100 includes a comparator 102 and a reference generator 104. Comparator 102 has an input node 106 and an output node 108. Node 106 receives an input signal IN. Node 108 outputs an output signal OUT. Reference generator 104 has an output connected to node 110 to provide a reference signal REF. Both comparator 102 and reference generator 104 connect to a supply node 111 to receive a supply voltage, Vcc. Comparator 102 compares the IN and REF signals and outputs the OUT signal as a delayed version of the IN signal.

Figure 2:
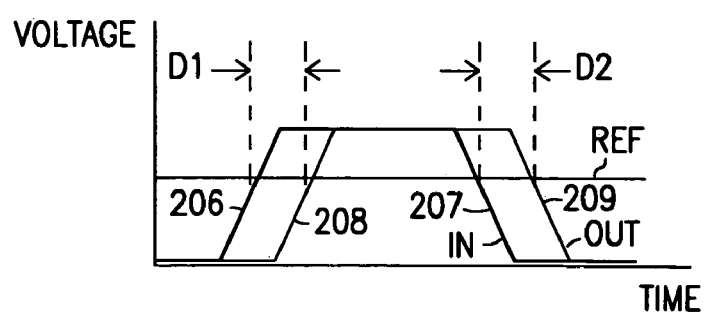
FIG. 2 shows an example of a signal relationship between input and output signals of the delay circuit of FIG. 1.

FIG. 2 shows an example of a signal relationship among the REF, IN and OUT signals. In FIG. 2, the IN signal has a rising edge 206 and a falling edge 207. The OUT signal has a rising edge 208 and a falling edge 209. Edge 206 is delayed from edge 208 a time delay (or a delay) indicated by D1. Edge 207 is delayed from edge 209 a time delay indicated by D2. In some embodiments, reference generator 104 is configured to adjust D1 to change the signal relationship (or the delay) between the IN and OUT signals. For example, in some embodiments, reference generator 104 is configured in one configuration to decrease D1 based on one condition of voltage and temperature. As another example, reference generator 104 is configured in another configuration based on another condition of voltage and temperature to increase D1.

In some embodiments, reference generator 104 is configured such that at certain condition of temperature, D1 is decreased when Vcc is at a first value, and increased when Vcc is at a second value. In other embodiments, reference generator 104 is configured such that at certain condition of temperature, D1 is decreased when the first value of Vcc is lower than the second value of Vcc. In some other embodiments, reference generator 104 is configured such that at certain condition of temperature, D1 is decreased when the first value of Vcc is higher than the second value of Vcc.

Reference generator 104 is configured to vary the REF signal to adjust D1 to change the signal relationship between the IN and OUT signals. In some embodiments, the voltage level (or signal level) of the REF is varied to adjust D1. For example, in some embodiments, the voltage level of the REF signal is decreased to decrease D1 and increased to increase D1. As another example, in other embodiments, the voltage level of the REF signal is increased to decrease D1 and decreased to increase D1.

In some embodiments, reference generator 104 is configured to adjust D2 in a similar manner as that of the configuration for adjusting D1 as described above.

Figure 3:
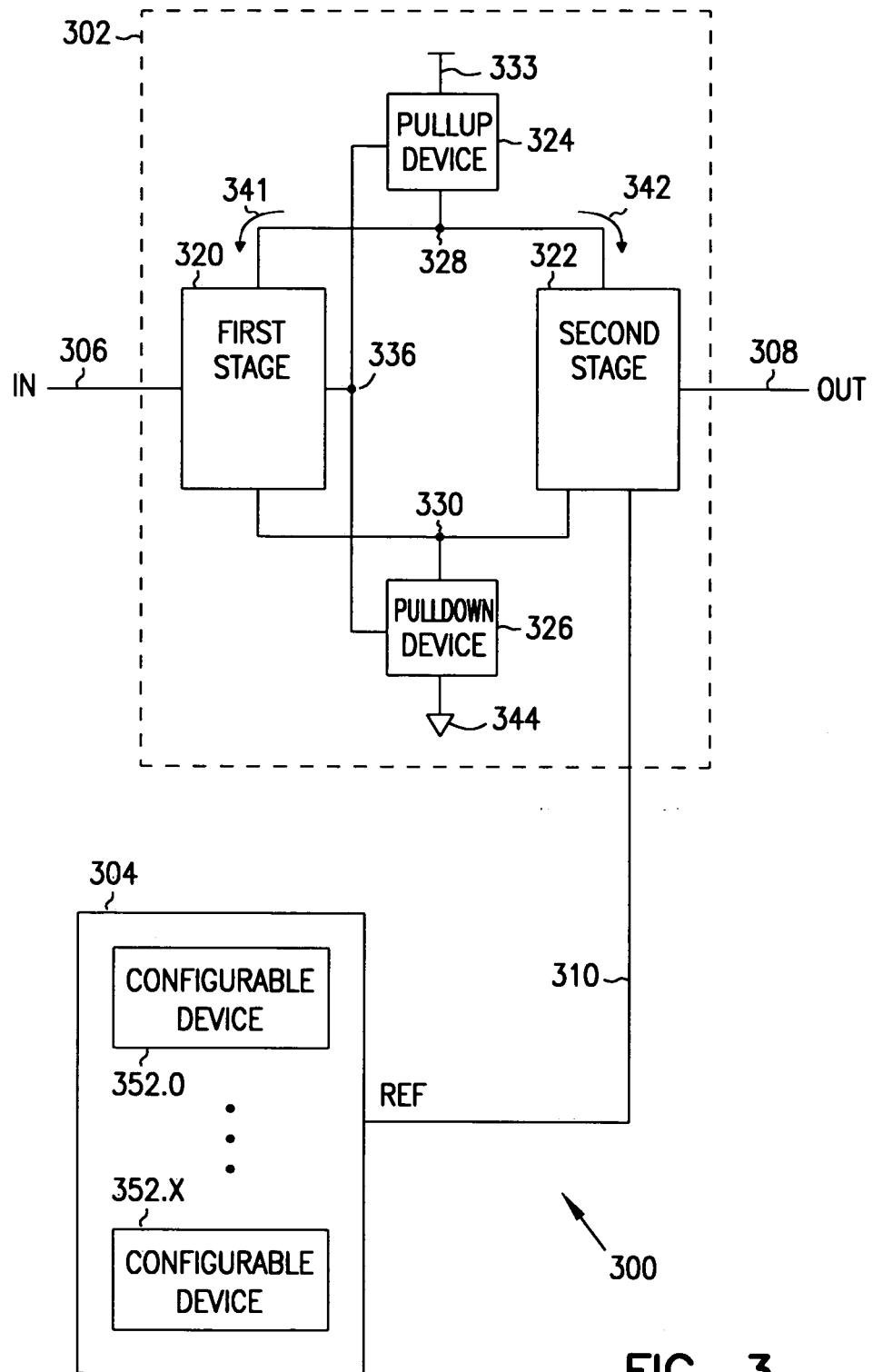
FIG. 3 shows a delay circuit according to another embodiment of the invention.

FIG. 3 shows a delay circuit according to an embodiment of the invention. Delay circuit 300 includes a comparator 302, and a reference generator 304. Comparator 302 represents comparator 102 (FIG. 1). Reference generator 304 represents reference generator 104 (FIG. 1).

Comparator 302 includes a first stage 320, a second stage 322, a pullup device 324, and a pulldown device 326. First and second stages 320 and 322 connect in parallel with each other and in between a pullup node 328 and a pulldown node 330. Pullup device 324 connects between node 328 and a supply node 333. Pulldown device 326 connects between node 330 and another supply node 344. Both pullup device 324 and pulldown device 326 connect to first stage 320 at node 336.

First stage 320 has an input node 306 to receive an input signal IN. Second stage 322 has an input node connected to a comparator reference node 310 to receive a reference input signal REF. Second stage 322 also has an output node 308 to produce an output signal OUT. The IN, OUT, and REF signals are similar in both FIG. 1 and FIG. 3.

Reference generator 304 includes a plurality of configurable devices 352.0 through 352.X (352.0–352.X). In some embodiments, configurable devices 352.0–352.X include fuse devices. In other embodiments, configurable devices 352.0–352.X include fuseable devices such as electrical fuse and laser fuse. In some other embodiments, configurable devices 352.0–352.X include transistors having metal options. Further, in alternative embodiments, configurable devices 352.0–352.X include a combination of fusable devices, and transistors having metal options. Configurable devices 352.0–352.X are configured to vary the REF signal to adjust the signal relationship between the IN and OUT signals.

Pullup device 324, first stage 320, and pulldown device 326 form a first current path 341 between supply nodes 333 and 344. Pullup device 324, second stage 322, and pulldown device 326 form a second current path 342 between supply nodes 333 and 344. The amount of current flowing in each of the current paths 341 and 342 depends on the IN and REF signals. The signal level of the OUT signal depends on the difference in the IN and REF signals. For example, when the IN signal is lower than the REF signal, the OUT signal has a low signal level. When the IN signal is higher than the REF signal, the OUT signal has a high signal level.

Figure 4:
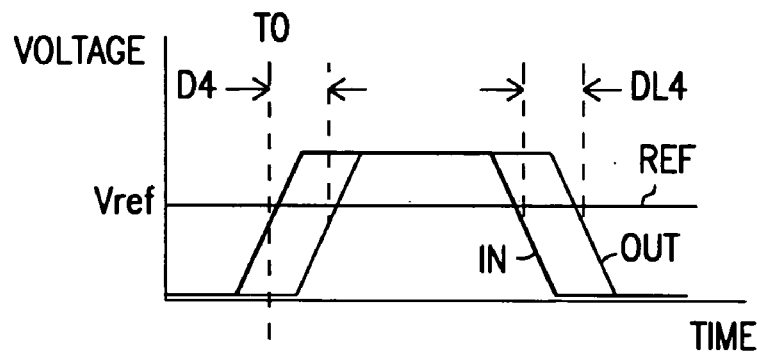
FIGS. 4–6 show examples of signal relationships of signals of the delay circuit of FIG. 3.

FIG. 4 shows an example of the signal relationship among the IN, OUT, and REF signals of FIG. 3. FIG. 4 shows an example when the IN signal is lower than the REF signal, the OUT signal has a low signal level, and when the IN signal is higher than the REF signal, the OUT signal has a high signal level. As shown in FIG. 4, before time T0, the IN signal has signal level that is lower than signal level (Vref) of the REF signal, and the OUT signal has a low signal level. After time T0, the signal level of the IN signal is higher than signal level of the REF signal, and the OUT signal has a high signal level. In some embodiments, the low signal level and the high signal level correspond to logic 0 and logic 1 in digital circuits.

In FIG. 4, D4 indicates the delay between rising edges of the IN and OUT signals. D4 can be adjusted by varying the REF signal based on certain temperature and the voltage level of node 333 (FIG. 3). In some embodiments, configurable devices 352.0–352.X of reference generator 304 are configured such that the REF signal is decreased to decrease D4 and such that the REF signal is increased to increase D4.

In other embodiments, configurable devices 352.0–352.X are configured such that the REF signal is increased to decrease D4 and such that the REF signal is decreased to increase D4.

FIG. 4 also shows DL4 to indicate a delay between falling edges of the IN and OUT signals. DL4 can also be adjusted by varying the REF signal based on certain temperature and the voltage level of node 333 (FIG. 3).

Figure 5:
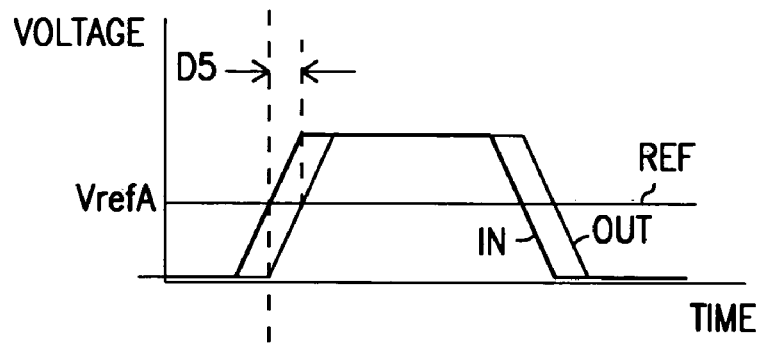
Figure 6:
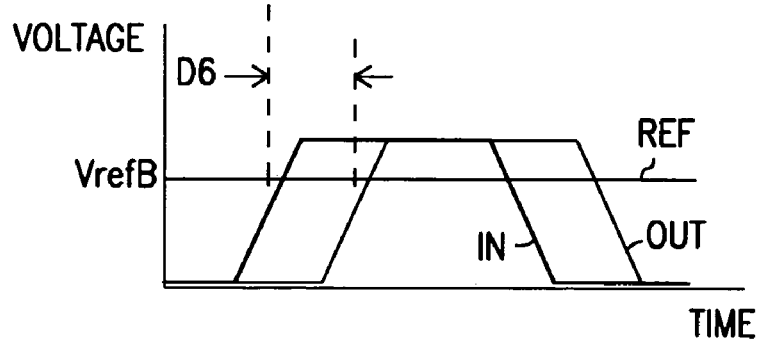

FIG. 5 and FIG. 6 show examples of a signal relationship among the IN, OUT, and REF signals when the REF signal of FIG. 4 is varied. For comparison purposes, T0 in all FIGS. 4–6 is chosen as a reference time and FIG. 4 is chosen as a reference starting point. In FIGS. 4–6, D4, D5, and D6 are delays between the IN and OUT signals. In FIG. 5, varying the signal level of the REF signal from Vref to VrefA decreases the delay between the IN and OUT signals to D5, which is relatively smaller than D4. Thus, varying the REF signal from Vref to VrefA changes the signal relationship between the IN and OUT signals. In FIG. 6, varying the signal level of the REF signal from Vref to VrefB increases the delay between the IN and OUT signals becomes D6. Thus, varying the REF signal from Vref to VrefB changes the signal relationship between the IN and OUT signals.

In FIGS. 4–6, Vref, VrefA, and VrefB are drawn to illustrate various signal levels; they do not represent absolute values. In some embodiments, VrefA is lower than Vref. In other embodiments, VrefA is higher than Vref. In some embodiments, VrefB is lower than Vref. In other embodiments, VrefB is higher than Vref.

Figure 7:
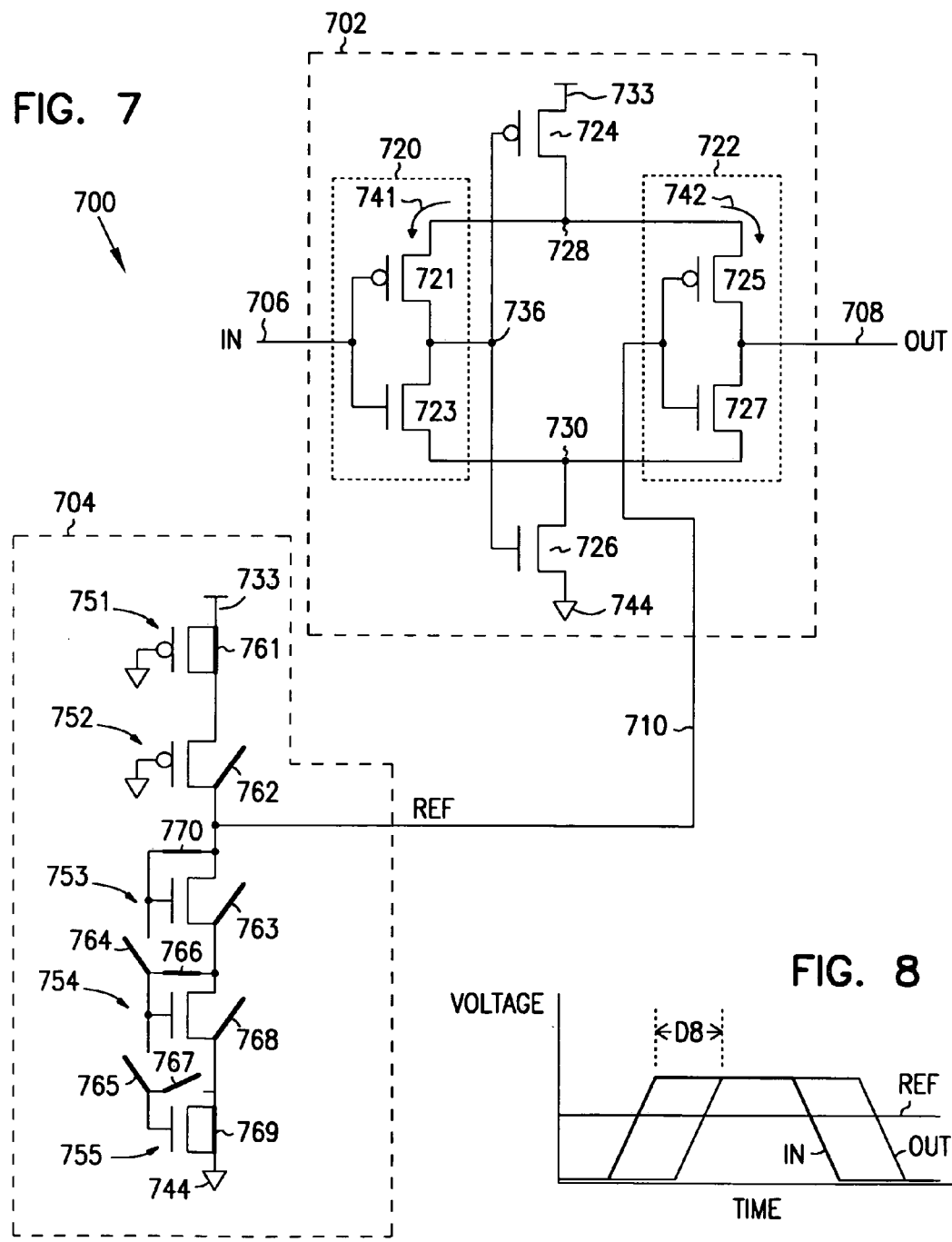
FIG. 7 shows a delay circuit according to another embodiment of the invention.

FIG. 7 shows a delay circuit according to another embodiment of the invention. Delay circuit 700 includes a comparator 702 and a reference generator 704. Comparator 702 represents comparator 102 (FIG. 1) and comparator 302 (FIG. 3). Reference generator 704 represents reference generator 104 (FIG. 1) and reference generator 304 (FIG. 3).

Comparator 702 includes transistor 721, 723, 724, 725, 726, and 727. Transistors 721 and 723 form a transistor pair 720 which forms an input stage corresponding to first stage 320 (FIG. 3). Transistors 725 and 727 form a transistor pair 722 which forms an input stage corresponding to second stage 322 (FIG. 3). Transistor 724 forms a pullup device corresponding to pullup device 324 (FIG. 3). Transistor 726 forms a pulldown device corresponding to pulldown device 326 (FIG. 3).

Transistors 721 and 723 have a common gate connected to node 706 to receive the IN signal, and a common drain connected to node 736. Transistors 725 and 727 have a common gate connected to a comparator reference node 710, and a common drain connected to node 708 to generate the OUT signal. Transistor 724 has a source connected to node 733, a drain connected to node 728, and a gate connected to node 736. Transistor 726 has a source connected to node 744, a drain connected to node 730, and a gate connected to node 736.

Reference generator 704 includes transistors 751, 752, 753, 754, 755 (751–755), and configurable elements 761, 762, 763, 764, 765, 766, 767, 768, 769, and 770 (761–770). Transistors 751–755 connect in series between supply nodes 733 and 744. Transistors 751–755 and configurable elements 761–770 form a plurality of configurable devices corresponding to configurable devices 352.0–352.X (FIG. 3).

Transistors 751 and 752 form a plurality of configurable load transistors connected between nodes 733 and 710. Transistors 751 and 752 form a plurality of configurable output transistors connected between nodes 710 and 744.

Each of the configurable elements 761–770 is located between a drain and source, or between a gate and source of each of the transistors 751–755, or between the gates of two transistors. Each of the configurable elements 761–770 can be configured to connect (close) or to disconnect (open) the drain and source, or the gate and source of each of the transistors 751–755, or the gates of two transistors. Thus, each of the transistors 751–755 has a configurable drain-to-source connection, or a configurable gate-to-source connection, or both configurable drain-to-source and configurable gate-to-source connections. And transistors 751–755 also have configurable gate-to-gate connections. For example, configurable element 763 is located between the drain and source of transistor 753; configurable element 764 is located between the gates of transistors 753 and 754; and configurable element 766 is located between the gate and drain of transistor 754. Drain and source of a transistor are used interchangeably in this specification.

Transistors 751–755 and configurable elements 761–770 are configured as one of many different possible configurations. In the configuration shown in FIG. 7, configurable elements 761, 766, 769, and 770 are in a "closed" (connected or shorted) position, and configurable elements 762, 763, 764, 765, and 767 are in an "opened" (disconnected) position. This configuration gives one signal level for the REF signal. In other embodiments, transistors 751–755 and configurable elements 761–770 can be configured in other configurations by choosing other "closed" and "opened" combinations of configurable elements 761–770 to obtain other signal levels for the REF signal.

Configurable elements 761–770 represent any configurable elements known to those skilled in the art. For example, configurable elements 761–770 can be metal options which can be configured by different opened and closed combinations. In other embodiments, configurable elements 761–770 can be fuses which can be configured by blowing the fuses using any known method. In some other embodiments, configurable elements 761–770 can be antifuses which can be configured by programming the antifuses devices using any known method. Other types of configurable elements can be used in alternative embodiments of the present invention.

Transistors 721, 724, 725, 751, and 752 are p-channel metal oxide semiconductor field effect transistors (PMOSFET), also referred to as "PFET" or "PMOS". Transistors 723, 726, 727, 753, 754, and 755 are n-channel metal oxide semiconductor field effect transistors (NMOSFET) also referred to as "NFET" or "NMOS". In other embodiments, the types of transistors can be reversed. For example, transistors 721, 724, 725, 751, and 752 can be NMOS transistors and transistors 723, 726, 727, 753, 754, and 755 can be PMOS transistors.

Other types of transistors can also be used in place of the NMOS and PMOS transistors of FIG. 7. For example, embodiments exist that use bipolar junction transistors (BJTs) and junction field effect transistors (JFETs.) One of ordinary skill in the art will understand that many other types of transistors and other elements can be used in alternative embodiments of the present invention.

In FIG. 7, the signal level of the OUT signal depends on the signal relationship between the IN and REF signals. When the IN signal is lower than the REF signal, the voltage level at node 708 is low. When the IN signal is higher than the REF signal, the voltage level at node 708 is high.

Figure 8:
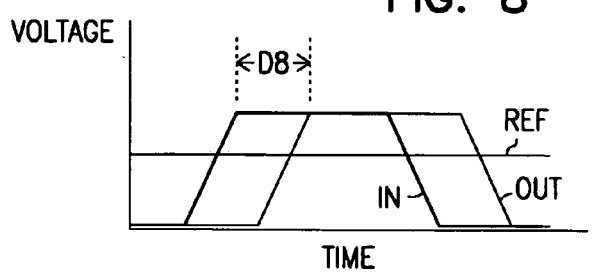
FIG. 8 shows a signal relationship of the delay circuit of FIG. 7.

FIG. 8 shows a signal relationship of the delay circuit of FIG. 7. In FIG. 8, D8 indicates a delay between the IN and OUT signals. This delay can be adjusted by varying the REF signal of FIG. 7. In FIG. 7, the REF signal can be varied by configuring transistors 751–755 and configurable elements 761–770 in different ways. For example, to increase the signal level of the REF signal, configurable 767 would be closed and configurable element 769 would be opened. With that configuration, an additional voltage drop exists between the source and drain of transistor 755, thereby increasing the voltage level at node 710 and also the signal level of the REF signal. As another example, to decrease the signal level of the REF signal, configurable element 766 would be opened and configurable element 768 would be closed. In this example, the voltage drop between the source and drain of transistor 754 disappears, thereby decreasing the voltage level at node 710 and also the signal level of the REF signal.

Figure 9:
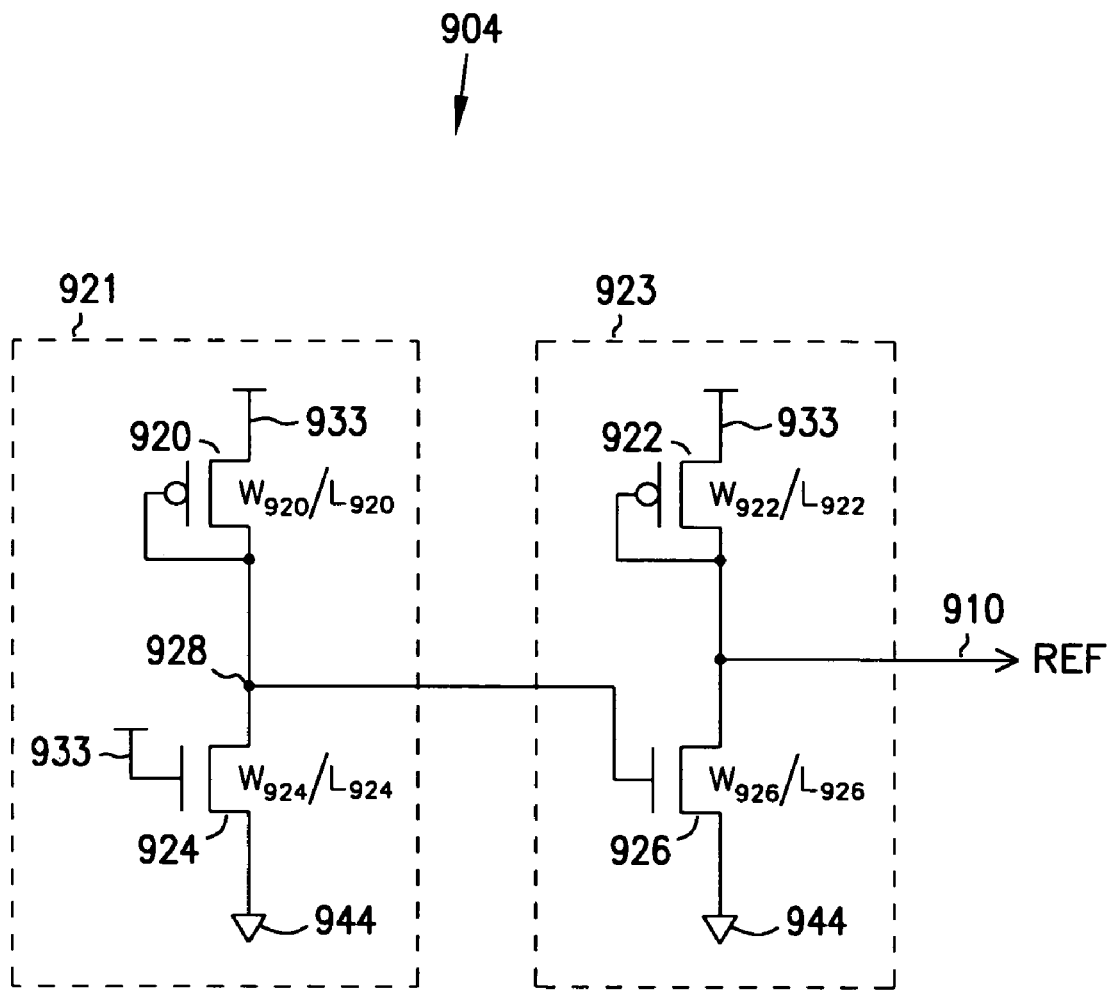
FIG. 9 shows a reference generator according to an embodiment of the invention.

FIG. 9 shows a reference generator according to an embodiment of the invention. Reference generator 904 can be used as an embodiment for reference generators 104 (FIG. 1), 304 (FIG. 3), or 704 (FIG. 7). Reference generator 904 includes load transistors 920, and 922, a bias transistor 924, an output transistor 926, and a reference output node 910. Transistors 920 and 924 form a bias stage 921. Transistor 922 and 926 form an output stage 923. Each of the transistors 920 and 922 is a diode-connected transistor. A diode-connected transistor has a gate connected to a drain such that the gate-to-source voltage and the drain-to-source voltage are equal.

Transistor 920 has a source connected to a supply node 933, and a gate and a drain connected together at node 928. Transistor 922 has a source connected to node 933, and a gate and a drain connected together at an output node 910. Transistor 924 has a drain connected to node 928, a source connected to a supply node 944, and a gate connected to node 933. Transistor 926 has a gate connected to node 928, a source connected to node 944, and a drain connected to node 910.

Each of the transistors 920, 922, 924, and 926 has a channel width (W), a channel length (L), and a channel width to channel length (W/L) ratio. In FIG. 9, $W_{920}/L_{920}$, $W_{922}/L_{922}$, $W_{924}/L_{924}$, and $W_{926}/L_{926}$ indicate the channel width to channel length ratios of transistors 920, 922, 924, and 926, respectively.

Reference generator 904 generates a reference signal REF on node 910. The REF signal can be varied by configuring (or selecting) the W and the L of each of the transistors 920, 922, 924, and 926, or each of the $W_{920}/L_{920}$, $W_{922}/L_{922}$, $W_{924}/L_{924}$. For example, in some embodiments, transistors 920, 922, 924, and 926 are configured in a first configuration such that reference generator 904 outputs the REF signal having a first signal level. As another example, in other embodiments, transistors 920, 922, 924, and 926 are configured in a second configuration such that reference generator 904 outputs the REF signal having a second signal level. In some other embodiments, other configurations of transistors 920, 922, 924, and 926 generate other reference signals having other values unequal to the first value or the second value.

Figure 10:
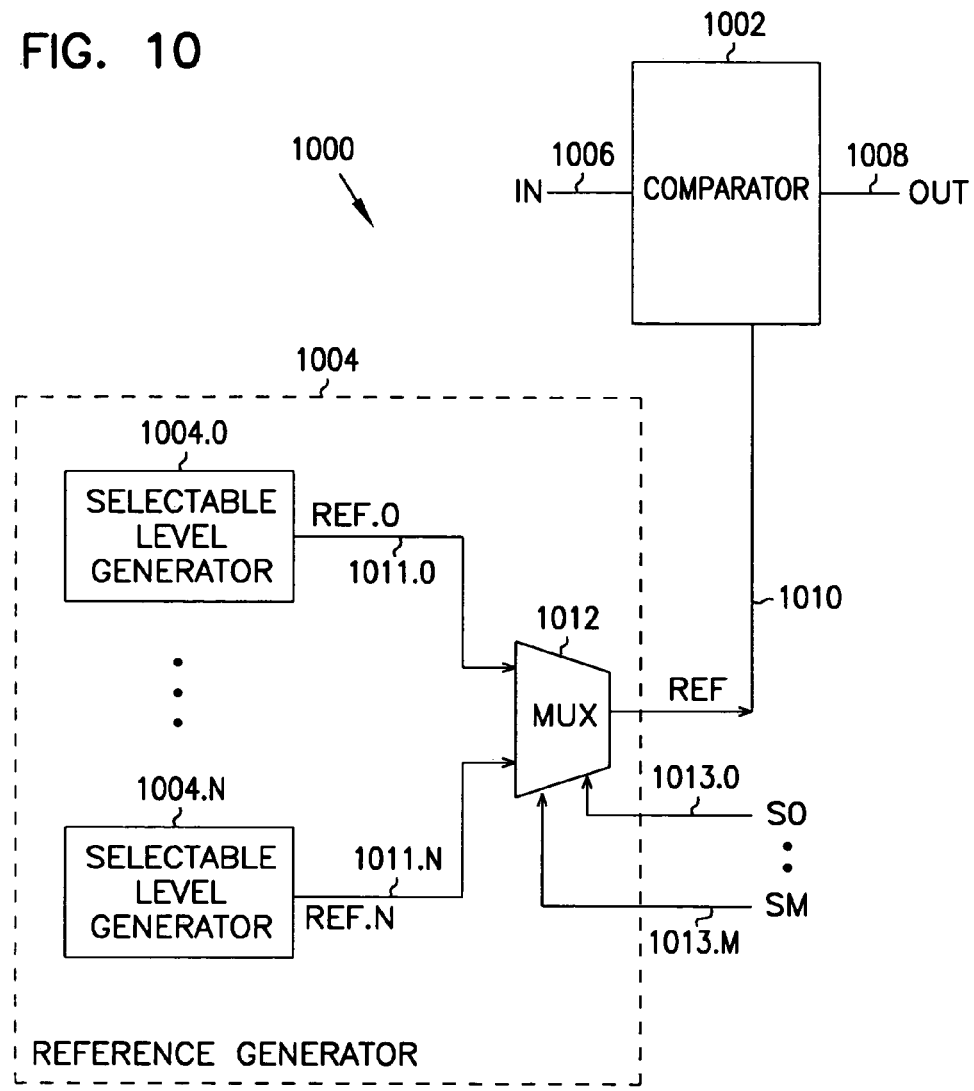
FIG. 10 shows a delay circuit according to another embodiment of the invention.

FIG. 10 shows a delay circuit according to another embodiment of the invention. Delay circuit 1000 includes a comparator 1002 and a reference generator 1004.

Comparator 1002 represents comparator 102 (FIG. 1). In some embodiments, comparator 1002 includes embodiments of comparator 302 (FIG. 3) and comparator 702 (FIG. 7). Comparator 1002 includes an input node 1006 to receive an input signal IN, and an output node to output an output signal OUT.

Reference generator 1004 includes a plurality of selectable level generators 1004.0 through 1004.N (1004.0–1004.N) and a multiplexor (MU) 1012 (or selector 1012). Signal level generators 1004.0–1004.N and MUX 1012 connect together via nodes 1011.0 through 1011.N (1011.0–1011.N).

Each of the selectable level generators 1004.0–1004.N includes a selectable output node connected to one of nodes 1011.0–1011.N to provide one of selectable signals REF.0 through REF.N (REF.0–REF.N). For example, selectable level generator 1004.0 includes a selectable output node connected to node 1011.0 to provide the REF.0 signal; selectable level-generator 1004.N includes a selectable output node connected to node 1011.N to provide the REF.N signal.

In some embodiments, each of the selectable signals REF.0–REF.N has a different signal level. In some embodiments, each of the selectable level generators 1004.0–1004.N includes embodiments of reference generator 704 (FIG. 7) or embodiments of reference generator 904 (FIG. 9). In some of these embodiments, each of the selectable level generators 1004.0–1004.N is configured in a different configuration to output a different selectable output signal. Therefore, in some of these embodiments, a selectable output signal of one selectable level generator is unequal to a selectable output signal of another selectable level generator.

MUX 1012 includes a plurality of input nodes connected to nodes 1011.0–1011.N to receive the REF.0–REF.N signals. MUX 1012 has an output connected to node 1010 to provide a reference signal REF. MUX 1012 also has a plurality of select nodes 1013.0 through 1013.M (1013.0–1013.M) to receive a plurality of select signals S0 through SM (S0–SM). A combination of the S0–SM signals selects one of the REF.0–REF.N signals as the REF signal.

Figure 11:
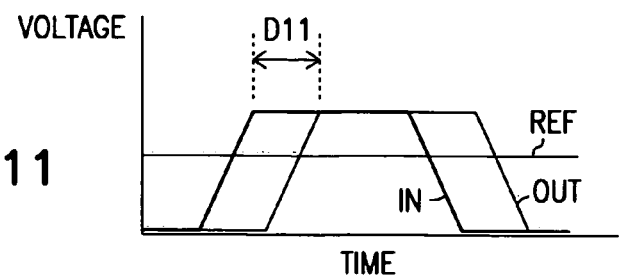
FIG. 11 shows an example of a signal relationship among the signals of the delay circuit of FIG. 10.

FIG. 11 shows an example of a signal relationship among the IN, OUT, REF signals of the delay circuit 1000 of FIG. 10. In FIG. 11, D11 indicates the delay between the IN and OUT signals. D11 can be adjusted to change the signal relationship between the IN and OUT signals by varying the REF signal.

In FIG. 10, the REF signal can be varied to adjust D11 by selecting different combinations of the S0–SM signals. D11 depends on the REF signal which is one of the REF.0–REF.N signals selected by a combination of the S0–SM signals. Since the REF.0–REF.N signals have different signal levels, a different combination of the S0–SM signals can be selected to select a different one of the REF.0–REF.N signals to be the REF signal to adjust D11.

In some embodiments, each of the selectable level generators 1004.0–1004.N includes embodiments of reference generator 704 (FIG. 7). In other embodiments, each of the selectable level generators 1004.0–1004.N includes embodiments of reference generator 904 (FIG. 9).

Figure 12:
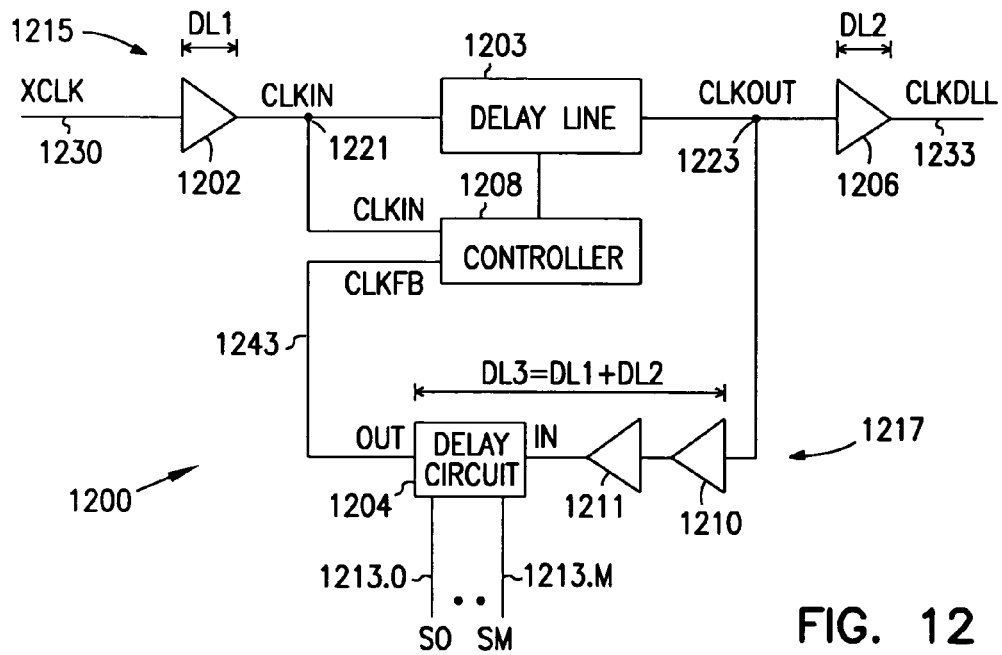
FIG. 12 shows a delay system according to an embodiment of the invention.

FIG. 12 shows a delay system according to an embodiment of the invention. Delay system 1200 includes an input buffer 1202, a delay line 1203, an output buffer 1206, a controller 1208, an ouput model circuit 1210, an input model circuit 1211, and a delay circuit 1204. Input buffer 1202, delay line 1203, and output buffer 1206 form a forward path 1215. Ouput model circuit 1210, input model circuit 1211, and delay circuit 1204 form a feedback path 1217.

Delay system 1200 also includes an input node 1230 to receive an input signal XCLK. The XCLK signal passes through forward path 1215 and becomes an output signal CLKDLL at output node 1233. The CLKDLL signal is a delayed version of the XCLK signal. In some embodiments, the XCLK and the CLKDLL signal are synchronized.

Two other signals exist on forward path 1215, a delayed input signal CLKIN signal at node 1221 and a delayed signal CLKOUT at node 1223. The CLKIN is a delayed version of the XCLK signal and is delayed by a delay DL1 of input buffer 1202. The CLKOUT is a delayed version of the CLKIN signal and is delayed by a delay of delay line 1203. Further, CLKDLL signal is a delayed version of the CLKOUT signal and is delayed by a delay DL2 of output buffer 1206.

Feedback path 1217 receives the CLKOUT signal and provides a feedback signal CLKFB. The CLKFB signal is the CLKOUT signal delayed by a delay DL3. In some embodiments, input model circuit 1211 and input buffer 1202 have identical construction. In other embodiments, input model circuit 1211 and input buffer 1202 have equal delays. In some embodiments, output model circuit 1210 and output buffer 1206 have identical construction. In other embodiments, output model circuit 1210 and output buffer 1206 have equal delays. In FIG. 12, the combination of ouput model circuit 1210, input model circuit 1211, and delay circuit 1204 is constructed to be a model of the combination of input buffer 1202 and output buffer 1206 such that DL3=DL1+DL2.

Delay circuit 1204 includes an input connected to input model 1211 to receive an input signal IN and output connected to controller 1208 to provide an output signal OUT. The IN signal is a delayed version of the CLKOUT signal. The OUT signal is the same as the CLKFB signal. Delay circuit 1204 also includes a plurality of select nodes 1213.0 through 1213.M (1213.0–1213.M) to receive a plurality of select signals S0–SM. Delay circuit 1204 represents embodiments of a delay circuit corresponding to delay circuit 1000 (FIG. 10). The IN and OUT signals are similar in both FIG. 12 and FIG. 10. Select node 1213.0–1213.M are similar to select nodes 1013.0–1013.M (FIG. 10). The S0–SM signals are similar in both FIG. 12 and FIG. 10. In some embodiments, delay circuit 1204 adjusts a signal relationship between the IN and OUT signals to keep the XCLK and CLKDLL signals synchronized by selecting a combination of the S0–SM signals.

In some embodiments, delay line 1203 includes a plurality of delay cells connected in series. Each delay cell can delay a signal for a predetermined amount of time. The amount of delay applied to the CLKIN signal varies according to the number of delay cells selected.

In some embodiments, controller 1208 includes a phase detector that detects and compares a difference between the edges of two signals. In FIG. 12, controller 1208 compares the CLKIN and CLKFB signals. When the CLKIN and CLKFB signals are not synchronized, controller 1208 performs a shifting operation to adjust the amount of delay applied to the CLKIN signal by delay line 1203. When the CLKIN and CLKFB signals are synchronized, controller 1208 stops the shifting operation and puts delay system 1200 in a locked position. When the CLKIN and the CLKFB signals are synchronized during the locked position, the XCLK and CLKDLL signals are also synchronized because feedback path 1217 is a model of input buffer 1202 and output buffer 1206 in which DL3=DL1+DL2. In some embodiments, the XCLK and CLKDLL signals are synchronized within a predetermined lock window (or a predetermined delay). In some embodiments, the predetermined lock window is less than or equal to the delay of one delay cell.

Figure 13:
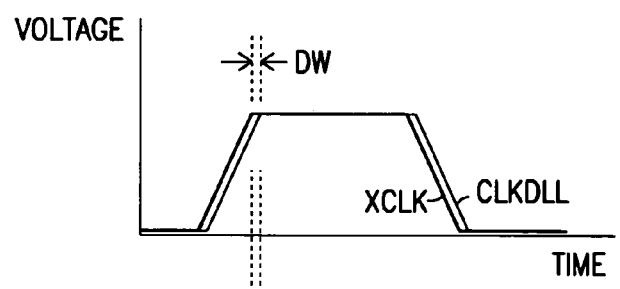
FIG. 13 shows an example of a signal relationship among some signals of the delay system of FIG. 12.

FIG. 13 shows an example of the XCLK and CLKDLL signals when they are synchronized while delay system 1200 is in the locked position. DW indicates the predetermined lock window.

In some cases, when delay system 1200 is in the locked position, the XCLK and CLKDLL signals may be out of the predetermined lock window because of changes in operating conditions such as process, voltage, and temperature.

Figure 14:
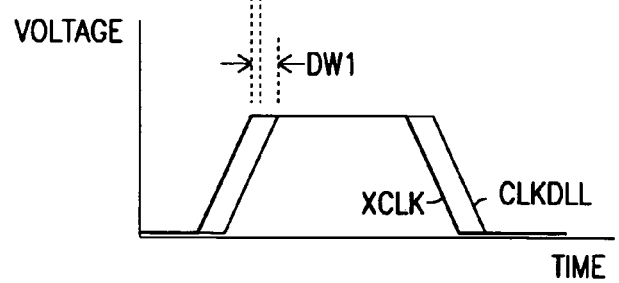
FIG. 14 shows an example of a signal relationship between an input signal and an output signal of the delay system of FIG. 12.

FIG. 14 shows an example of a signal relationship between the XCLK and CLKDLL signals being out of the predetermined lock window when delay system 1200 is in the locked position. DW1 indicates a delay between the XCLK and CLKDLL when delay system 1200 is in a locked position. DW1 is relatively greater than DW. In this example, DW1 can be adjusted so that the XCLK and CLKDLL are synchronized within DW by selecting a combination of the S0-SM. When a proper combination of the S0–SM signals is selected, delay circuit 1204 adjusts the OUT signal. Since the OUT signal is the CLKFB signal, adjusting the OUT signal also adjusts the signal relationship between the CLKIN and CLKOUT signals. When the signal relationship between the CLKIN and CLKOUT signals is adjusted, signal relationship between the XCLK and CLKDLL signals is also adjusted.

What is claimed is:

1. A delay locked loop comprising:
   a forward path for receiving an input signal to provide an output signal;
   a feedback path for providing a feedback signal based on the output signal, the feedback path including an adjustable delay circuit with a comparator located on the feedback path, the comparator including a node for receiving a reference signal generated by the adjustable delay circuit for influencing a timing of the feedback signal; and
   a controller responsive to a timing relationship between the feedback signal and the input signal for adjusting a timing of the output signal.

2. The delay locked loop of claim 1, wherein the adjustable delay circuit includes a number of select nodes for receiving a number of select signals to vary a timing of the reference signal.

3. A delay locked loop comprising:
   a forward path for receiving an input signal to provide an output signal;
   a feedback path for providing a feedback signal based on the output signal, the feedback path including an adjustable delay circuit for influencing a timing of the feedback signal; and
   a controller responsive to a timing relationship between the feedback signal and the input signal for adjusting a timing of the output signal, wherein the adjustable delay circuit includes:
   a reference generator for generating a reference signal; and
   a comparator responsive to the reference signal and the output signal for adjusting a delay on the feedback path.

4. The delay locked loop of claim 3, wherein the reference generator includes:
   a plurality of level generators for generating a plurality of selectable signals; and
   a selector for selecting one of the selectable signals to provide the reference signal.

5. The delay locked loop of claim 4, wherein at least one of the level generators includes a plurality of configurable devices, and wherein the configurable devices are configurable to adjust a timing of at least one of the selectable signals.

6. The delay locked loop of claim 5, wherein at least one of the configurable devices includes a transistor having a configurable drain-to-source connection.

7. The delay locked loop of claim 5, wherein at least one of the configurable devices includes a transistor having a configurable gate-to-source connection.

8. A delay locked loop comprising:
   a forward path for receiving an input signal to provide an output signal;
   a feedback path including a reference generator for generating a reference signal, a comparator for providing a feedback signal based on the reference signal and a delayed copy of the output signal, wherein the reference generator is configured to vary a timing of the reference signal for influencing a timing of the feedback signal; and
   a controller responsive to a timing relationship between the feedback signal and the input signal for adjusting a timing of the output signal.

9. The delay locked loop of claim 8, wherein the reference generator includes a number of select nodes for receiving a number of select signals to vary the timing of the reference signal.

10. The delay locked loop of claim 8, wherein the forward path includes:
    an input buffer for receiving a clock signal to provide the input signal;
    a delay line for delaying the input signal to provide the output signal; and
    an output buffer for receiving the output signal to provide an internal clock signal.

11. The delay locked loop of claim 10, wherein the feedback path further includes a circuit model of the input buffer and a circuit model of the output buffer for delaying the output signal to provide the delayed copy of the output signal.

12. The delay locked loop of claim 8, wherein the comparator includes:
    a first stage for receiving the delayed copy of the output signal to provide a first stage output signal;
    a second stage responsive to the first stage output signal and the reference signal for providing the feedback signal;
    a pullup device responsive to the first stage output signal for determining a first signal level of the reference signal in relation to a signal level of the first supply node; and
    a pulldown device responsive to the first stage output signal for determining a second signal level of the reference signal in relation to a signal level of the second supply node.

13. The delay locked loop of claim 8, wherein the reference generator includes:
    a plurality of level generators for generating a plurality of selectable signals; and
    a selector for selecting one of the selectable signals to provide the reference signal.

14. The delay locked loop of claim 13, wherein at least one of the level generators includes a stack of transistors, wherein the transistors are configurable to adjust a timing of at least one of the selectable signals.

15. The delay locked loop of claim 14, wherein the transistors include configurable gate-to-gate connections.

16. The delay locked loop of claim 14, wherein at least one of the transistors includes a configurable drain-to-source connection.

17. The delay locked loop of claim 14, wherein at least one of the transistors includes a configurable gate-to-source connection.

18. The delay locked loop of claim 13, wherein at least one of the level generators includes:
a bias stage having a bias node; and
an output stage having an output node for providing the reference signal with a timing based on a timing of a signal at the bias node.

19. The delay locked loop of claim 18, wherein the bias stage includes:
a diode-connected transistor coupled between the bias node and a first supply node; and
a bias transistor having a drain coupled to the bias node, a gate coupled to the first supply node, and a source coupled to a second supply node.

20. The delay locked loop of claim 18, wherein the output stage includes:
a diode-connected transistor coupled between the output node and the first supply node; and
an output transistor having a gate coupled to the bias node, a source coupled to the second supply node, and a drain coupled to the output node.

21. A delay locked loop comprising:
an input buffer for receiving a clock signal to provide an input signal;
a delay line for delaying the input signal to provide an output signal;
an output buffer for receiving the output signal to provide an internal clock signal;
a series combination of a circuit model of the input buffer, a circuit model of the output buffer, and an adjustable delay circuit for delaying the output signal to provide a feedback signal, the adjustable delay circuit including comparator, the comparator including a node for receiving a reference signal generated by the adjustable delay circuit for influencing a timing of the feedback signal; and
a controller responsive to a timing relationship between the feedback signal and the input signal for adjusting the delay line to affect a timing relationship between the clock signal and the internal clock signal.

22. A delay locked loop comprising:
an input buffer for receiving a clock signal to provide an input signal;
a delay line for delaying the input signal to provide an output signal;
an output buffer for receiving the output signal to provide an internal clock signal;
a series combination of a circuit model of the input buffer, a circuit model of the output buffer, and an adjustable delay circuit for delaying the output signal to provide a feedback signal; and
a controller responsive to a timing relationship between the feedback signal and the input signal for adjusting the delay line to affect a timing relationship between the clock signal and the internal clock signal, wherein the adjustable delay circuit includes a number of select nodes for receiving a number of select signals, and a comparator for receiving a reference signal generated by the adjustable delay circuit to adjust a timing of the feedback signal.

23. A delay locked loop comprising:
an input buffer for receiving a clock signal to provide an input signal;
a delay line for delaying the input signal to provide an output signal;
an output buffer for receiving the output signal to provide an internal clock signal;
a series combination of a circuit model of the input buffer, a circuit model of the output buffer, and an adjustable delay circuit for delaying the output signal to provide a feedback signal; and
a controller responsive to a timing relationship between the feedback signal and the input signal for adjusting the delay line to affect a timing relationship between the clock signal and the internal clock signal, wherein the adjustable delay circuit includes:
a reference generator for generating a reference signal; and
a comparator responsive to the reference signal and a delayed copy of the output signal for adjusting the timing of the feedback signal.

24. The delay locked loop of claim 23, wherein the reference generator includes:
a plurality of level generators for generating a plurality of selectable signals; and
a multiplexor responsive to a number of select signals for selecting one of the selectable signals to provide the reference signal.

25. The delay locked loop of claim 24, wherein one of the level generators includes a transistor having a configurable drain-to-source connection.

26. The delay locked loop of claim 24, wherein one of the level generators includes a transistor having configurable gate-to-source connection.

27. The delay locked loop of claim 23, wherein at least one of the level generators includes:
a bias stage having a bias node; and
an output stage having an output node for providing the reference signal with a timing based on a timing of a signal at the bias node.

28. The delay locked loop of claim 23, wherein the comparator includes:
a first pair of transistors having a common drain, a first source, a second source, and a common gate for receiving the delayed copy of the output signal;
a second pair of transistors having a first source, a second source, and a common gate for receiving the reference signal, and a common drain for providing the feedback signal;
a pullup transistor having a gate coupled to the common drain of the first pair of transistors, a source coupled to a first supply node, and a drain coupled to the first source of the first pair of transistors and to first source of the second pair of transistor; and
a pulldown transistor having a gate coupled to the common drain of the first pair of transistors, a drain coupled to a second supply node, and a source coupled to the second source of the first pair of transistors and to second source of the second pair of transistor.

29. A method comprising:
delaying an input signal on a forward path to provide an output signal;
generating a feedback signal on a feedback path based on the output signal;
adjusting a delay on the feedback path based on a combination of a plurality of select signals to adjust a timing of the feedback signal, wherein adjusting the delay includes comparing a reference signal with the output signal and adjusting the reference signal to vary the delay on the feedback path; and
controlling a delay on the forward path based on a timing relationship between the feedback signal and the input signal to adjust a timing relationship between the input signal and the output signal.

30. A method comprising:
   delaying an input signal on a forward path to provide an output signal;
   generating a feedback signal on a feedback path based on the output signal;
   adjusting a delay on the feedback path to adjust a timing of the feedback signal; and
   controlling a delay on the forward path based on a timing relationship between the feedback signal and the input signal to adjust a timing relationship between the input signal and the output signal, wherein adjusting the delay on the feedback path includes:
      generating a reference signal;
      comparing the reference signal with the output signal; and
      varying the reference signal to adjust the delay on the feedback path.

31. The method of claim 30, wherein generating the reference signal includes:
   generating a number of selectable signals; and
   selecting from among the selectable signals a selectable signal to be the reference signal.

32. The method of claim 31, wherein selecting from among the selectable signals is based on a combination of a number of select signals.

33. The method of claim 31, wherein generating a number of selectable signals includes:
   configuring a first transistor to generate a first selectable signal having a first timing; and
   configuring a second transistor to generate a second selectable signal having a second timing.

34. The method of claim 33, wherein configuring one of the first and second transistors includes configuring a drain-to-source connection of one of the first and second transistors.

35. The method of claim 33, wherein configuring one of the first and second transistors includes configuring a gate-to-source connection of one of the first and second transistors.

36. The delay locked loop of claim 9, wherein the comparator includes:
   a plurality of stages to receive the delayed copy of the output signal and to provide the feedback signal;
   a pullup device responsive to an output signal of a first stage of the plurality of stages to determine a first signal level of the reference signal in relation to a signal level of a first supply node; and
   a pulldown device responsive to the output signal of the first stage of the plurality of stages to determine a second signal level of the reference signal in relation to a signal level of a second supply node.

37. The delay locked loop of claim 36, wherein the first stage is adapted to receive the delayed copy of the output signal and to provide the first stage output signal.

38. The delay locked loop of claim 37, wherein the plurality of stages includes a second stage responsive to the first stage output signal and the reference signal to provide the feedback signal.

39. The delay locked loop of claim 1, wherein the adjustable delay circuit includes:
   a plurality of level generators for generating a plurality of selectable signals; and
   a selector for selecting one of the selectable signals to provide the reference.

40. The delay locked loop of claim 1, wherein adjustable delay circuit includes a stack of transistors, wherein the transistors are configurable to adjust a timing of the feedback path.

41. The delay locked loop of claim 40, wherein the transistors include configurable gate-to-gate connections.

42. The delay locked loop of claim 40, wherein at least one of the transistors includes a configurable drain-to-source connection.

43. The delay locked loop of claim 40, wherein at least one of the transistors includes a configurable gate-to-source connection.

44. The delay locked loop of claim 1, wherein the adjustable delay circuit includes:
   a bias stage having a bias node; and
   an output stage having an output node for providing the reference signal with a timing based on a timing of a signal at the bias node.

45. The delay locked loop of claim 44, wherein the bias stage includes:
   a diode-connected transistor coupled between the bias node and a first supply node; and
   a bias transistor having a drain coupled to the bias node, a gate coupled to the first supply node, and a source coupled to a second supply node.

46. The delay locked loop of claim 44, wherein the output stage includes:
   a diode-connected transistor coupled between the output node and a first supply node; and
   an output transistor having a gate coupled to the bias node, a source coupled to a second supply node, and a drain coupled to the output node.

47. A delay locked loop comprising:
   an input buffer for receiving a clock signal to provide an input signal;
   a delay line for delaying the input signal to provide an output signal;
   an output buffer for receiving the output signal to provide an internal clock signal;
   a series combination of a circuit model of the input buffer, a circuit model of the output buffer, and an adjustable delay circuit for delaying the output sianal based on a combination of a plurality of select signals at a plurality of select nodes of the adjustable delay circuit to provide a feedback signal, wherein the adjustable delay circuit includes:
      a reference generator for generating a reference signal; and
      a comparator responsive to the reference signal and a delayed copy of the output signal for adjusting the timing of the feedback signal; and
   a controller responsive to a timing relationship between the feedback signal and the input signal for adjusting the delay line to affect a timing relationship between the clock signal and the internal clock signal.

48. A delay locked loop comprising:
   an input buffer for receiving a clock signal to provide an input signal;
   a delay line for delaying the input signal to provide an output signal;
   an output buffer for receiving the output signal to provide an internal clock signal;
   a series combination of a circuit model of the input buffer, a circuit model of the output buffer, and an adjustable delay circuit for delaying the output signal based on a combination of a plurality of select signals at a plurality of select nodes of the adjustable delay circuit to provide a feedback signal, wherein the adjustable delay circuit includes:
a plurality of level generators for generating a plurality of selectable signals; and
a selector for selecting one of the selectable signals to provide a reference signal used to adjust delay of the feedback signal; and
a controller responsive to a timing relationship between the feedback signal and the input signal for adjusting the delay line to affect a timing relationship between the clock signal and the internal clock signal.

49. A delay locked loop comprising:
an input buffer for receiving a clock signal to provide an input signal;
a delay line for delaying the input signal to provide an output signal;
an output buffer for receiving the output signal to provide an internal clock signal;
a series combination of a circuit model of the input buffer, a circuit model of the output buffer, and an adjustable delay circuit for delaying the output signal based on a combination of a plurality of select signals at a plurality of select nodes of the adjustable delay circuit to provide a feedback signal, wherein the adjustable delay circuit includes a stack of transistors, wherein the transistors are configurable to adjust a timing of the feedback signal; and
a controller responsive to a timing relationship between the feedback signal and the input signal for adjusting the delay line to affect a timing relationship between the clock signal and the internal clock signal.

50. The delay locked loop of claim 49, wherein the transistors include configurable gate-to-gate connections.

51. The delay locked loop of claim 49, wherein at least one of the transistors includes a configurable drain-to-source connection.

52. The delay locked loop of claim 49, wherein at least one of the transistors includes a configurable gate-to-source connection.

53. A delay locked loop comprising:
an input buffer for receiving a clock signal to provide an input signal;
a delay line for delaying the input signal to provide an output signal;
an output buffer for receiving the output signal to provide an internal clock signal;
a series combination of a circuit model of the input buffer, a circuit model of the output buffer, and an adjustable delay circuit for delaying the output signal based on a combination of a plurality of select signals at a plurality of select nodes of the adjustable delay circuit to provide a feedback signal, wherein the adjustable delay circuit includes:
a bias stage having a bias node; and
an output stage having an output node for providing a reference signal with a timing based on a timing of a signal at the bias node, the reference signal being used for adjusting a timing of the feedback signal; and
a controller responsive to a timing relationship between the feedback signal and the input signal for adjusting the delay line to affect a timing relationship between the clock signal and the internal clock signal.

54. The delay locked loop of claim 53, wherein the bias stage includes:
a diode-connected transistor coupled between the bias node and a first supply node; and
a bias transistor having a drain coupled to the bias node, a gate coupled to the first supply node, and a source coupled to a second supply node.

55. The delay locked loop of claim 53, wherein the output stage includes:
a diode-connected transistor coupled between the output node and a first supply node; and
an output transistor having a gate coupled to the bias node, a source coupled to a second supply node, and a drain coupled to the output node.

56. A delay locked loop comprising:
an input buffer for receiving a clock signal to provide an input signal;
a delay line for delaying the input signal to provide an output signal;
an output buffer for receiving the output signal to provide an internal clock signal;
a series combination of a circuit model of the input buffer, a circuit model of the output buffer, and an adjustable delay circuit for delaying the output signal to provide a feedback signal; and
a controller responsive to a timing relationship between the feedback signal and the input signal for adjusting the delay line to affect a timing relationship between the clock signal and the internal clock signal, wherein the adjustable delay circuit includes a number of select nodes for receiving a number of select signals to adjust a timing of the feedback signal, and, wherein the adjustable delay circuit includes:
a plurality of level generators for generating a plurality of selectable signals; and
a selector for selecting one of the selectable signals to provide a reference signal used to adjust delay of the feedback signal.

57. A delay locked loop comprising:
an input buffer for receiving a clock signal to provide an input signal;
a delay line for delaying the input signal to provide an output signal;
an output buffer for receiving the output signal to provide an internal clock signal;
a series combination of a circuit model of the input buffer, a circuit model of the output buffer, and an adjustable delay circuit for delaying the output signal to provide a feedback signal; and
a controller responsive to a timing relationship between the feedback signal and the input signal for adjusting the delay line to affect a timing relationship between the clock signal and the internal clock signal, wherein the adjustable delay circuit includes a number of select nodes for receiving a number of select signals to adjust a timing of the feedback signal, and, wherein the adjustable delay circuit includes a stack of transistors, wherein the transistors are configurable to adjust a timing of the feedback signal.

58. The delay locked loop of claim 57, wherein the transistors include configurable gate-to-gate connections.

59. The delay locked loop of claim 57, wherein at least one of the transistors includes a configurable drain-to-source connection.

60. The delay locked loop of claim 57, wherein at least one of the transistors includes a configurable gate-to-source connection.

61. A delay locked loop comprising:
- an input buffer for receiving a clock signal to provide an input signal;
- a delay line for delaying the input signal to provide an output signal;
- an output buffer for receiving the output signal to provide an internal clock signal;
- a series combination of a circuit model of the input buffer, a circuit model of the output buffer, and an adjustable delay circuit for delaying the output signal to provide a feedback signal; and
- a controller responsive to a timing relationship between the feedback signal and the input signal for adjusting the delay line to affect a timing relationship between the clock signal and the internal clock signal, wherein the adjustable delay circuit includes a number of select nodes for receiving a number of select signals to adjust a timing of the feedback signal, and, wherein the adjustable delay circuit includes:
- a bias stage having a bias node; and
- an output stage having an output node for providing a reference signal with a timing based on a timing of a signal at the bias node, the reference signal being used for adjusting the timing of the feedback signal.

62. The delay locked loop of claim 61, wherein the bias stage includes:
- a diode-connected transistor coupled between the bias node and a first supply node; and
- a bias transistor having a drain coupled to the bias node, a gate coupled to the first supply node, and a source coupled to a second supply node.

63. The delay locked loop of claim 61, wherein the output stage includes:
- a diode-connected transistor coupled between the output node and a first supply node; and
- an output transistor having a gate coupled to the bias node, a source coupled to a second supply node, and a drain coupled to the output node.

* * * * *

UNITED STATES PATENT AND TRADEMARK OFFICE
CERTIFICATE OF CORRECTION

| | | |
|---|---|---|
| PATENT NO. | : 7,142,032 B2 | Page 1 of 1 |
| APPLICATION NO. | : 11/003098 | |
| DATED | : November 28, 2006 | |
| INVENTOR(S) | : Silvestri | |

It is certified that error appears in the above-identified patent and that said Letters Patent is hereby corrected as shown below:

On the face page, in column 1, below "Meridian, ID (US) 83642" insert -- (73) Assignee: Micron Technology, Inc., Boise, ID, 83716 --.

On the face page, in column 2, below "Assistant Examiner–Cassandra Cox" insert -- (74) Attorney, Agent, or Firm – Schwegman, Lundberg, Woessner & Kluth, P.A. --.

In column 3, line 32, delete "fusable" and insert -- fuseable --, therefor.
In column 6, line 67, delete "(MU)" and insert -- (MUX) --, therefor.
In column 7, line 55, delete "ouput" and insert -- output --, therefor.
In column 7, line 58, delete "Ouput" and insert -- Output--, therefor.
In column 8, line 18, delete "ouput" and insert -- output --, therefor.
In column 9, line 60, in Claim 5, delete "ioop" and insert -- loop --, therefor.
In column 10, line 44, in Claim 12, delete "the" and insert -- a --, therefor.
In column 10, line 48, in Claim 12, delete "the" and insert -- a --, therefor.
In column 11, line 31, in Claim 21, after "signal" insert -- based on a combination of a plurality of select signals at a plurality of select nodes of the adjustable delay circuits --.

In column 11, line 32, in Claim 21, after "including" insert -- a --.
In column 12, line 46, in Claim 28, after "and to" insert -- the --.
In column 12, line 51, in Claim 28, after "and to" insert -- the --.
In column 14, line 1, in Claim 40, after "wherein" insert -- the --.
In column 14, line 43, in Claim 47, delete "sianal" and insert -- signal --, therefor.

Signed and Sealed this

Eighth Day of May, 2007

JON W. DUDAS
*Director of the United States Patent and Trademark Office*